(12) United States Patent
Kramer et al.

(10) Patent No.: US 10,969,746 B2
(45) Date of Patent: *Apr. 6, 2021

(54) MAGNETICALLY COMPENSATED CHIP SCALE ATOMIC CLOCK

(71) Applicant: TEXAS INSTRUMENTS INCORPORATED, Dallas, TX (US)

(72) Inventors: Bradley Allen Kramer, Plano, TX (US); Benjamin Stassen Cook, Los Gatos, CA (US); Juan Alejandro Herbsommer, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/730,332

(22) Filed: Dec. 30, 2019

(65) Prior Publication Data
US 2020/0142360 A1    May 7, 2020

Related U.S. Application Data

(63) Continuation of application No. 15/393,096, filed on Dec. 28, 2016, now Pat. No. 10,520,900.

(51) Int. Cl.
*G04F 5/14* (2006.01)
*H03B 17/00* (2006.01)
(Continued)

(52) U.S. Cl.
CPC ............... *G04F 5/14* (2013.01); *G04F 5/145* (2013.01); *H01S 5/02453* (2013.01); *H01S 5/0687* (2013.01); *H03B 17/00* (2013.01); *H03L 7/26* (2013.01); *H01S 5/005* (2013.01); *H01S 5/022* (2013.01); *H01S 5/02438* (2013.01); *H01S 5/183* (2013.01)

(58) Field of Classification Search
CPC .... H01S 5/02453; H01S 5/0687; H01S 5/183; H01S 5/005; H01S 5/02438; H03L 7/26; H03L 5/145; H03B 17/00; G04F 5/14; G04F 5/145
USPC .................................................... 331/3, 94.1
See application file for complete search history.

(56) References Cited

U.S. PATENT DOCUMENTS 8,253,497 B2    8/2012  Aoyama
9,118,336 B2    8/2015  Gu
(Continued)

*Primary Examiner* — Arnold M Kinkead
(74) *Attorney, Agent, or Firm* — Michael A. Davis, Jr.; Charles A. Brill; Frank D. Cimino

(57) ABSTRACT

In described examples, a physics cell includes: a laser source configured to emit light towards an atomic chamber containing an atomic gas; a photodetector configured to receive emissions from the atomic chamber; and a field coil for generating a magnetic field in the atomic chamber. An electronics circuit includes: a controller circuit coupled to the photodetector output and having control outputs to a digital to analog converter circuit; the digital to analog converter circuit having a coil current output to adjust the magnetic field, a modulation control output to control a modulation of the light, and having an output to control a voltage controlled oscillator; and a radio-frequency output circuit having a voltage controlled oscillator coupled to the output of the digital to analog converter circuit outputting a radio frequency signal to the laser source in the physics cell.

9 Claims, 5 Drawing Sheets

(51) Int. Cl.
*H03L 7/26* (2006.01)
*H01S 5/024* (2006.01)
*H01S 5/0687* (2006.01)
*H01S 5/183* (2006.01)
*H01S 5/00* (2006.01)
*H01S 5/022* (2021.01)

(56) References Cited

U.S. PATENT DOCUMENTS

| | | |
|---|---|---|
| 10,520,900 B2 * | 12/2019 | Kramer ................ H01S 5/0687 |
| 2006/0022761 A1 | 2/2006 | Abeles |
| 2014/0292426 A1 | 10/2014 | Maki |
| 2016/0378065 A1 | 12/2016 | Rochat et al. |

* cited by examiner

MAGNETICALLY COMPENSATED CHIP SCALE ATOMIC CLOCK

CROSS-REFERENCE TO RELATED APPLICATION

This application is a continuation of U.S. patent application Ser. No. 15/393,096, now U.S. Pat. No. 10,520,900, filed Dec. 28, 2016, the entirety of which is incorporated herein by reference.

BACKGROUND

This relates generally to atomic clocks, and more particularly to an atomic clock with compensation for fluctuating external magnetic fields.

Atomic clocks are very accurate and stable time keeping devices that use the natural vibrations of an atomic system for regulation. Atomic clock accuracy is increasingly desirable in portable navigational systems for improved positional accuracy. Miniaturized versions of the atomic clock, sometimes referred to as a chip scale atomic clock (CSAC), use integrated circuits built with advanced semiconductor processes. The stability of the operating environment is a challenge for CSAC devices. An atomic clock can be divided into three parts: the physical portion (or physics cell); the electronics portion; and the package. The three pieces may be fabricated separately and assembled later.

Physics cells of CSACs are sometimes built using MEMS technology. A typical physics cell has at least a laser source, some passive optical components (lenses, quarter wave-polarizer, etc.), a chamber including an atomic gas, a photodetector, a heater, a thermal sensor, and a field coil to induce an internal magnetic field through the atomic chamber. The electronics portion of the CSAC includes control electronics and a voltage to be applied to a voltage controlled oscillator (VCO) to produce an output clock. A ceramic module typically forms a package containing the physics cell and electronics.

In an atomic clock the laser excites the external electron of the alkali atoms of the cell (typically Cesium or Rubidium) from the ground state to an excited state. These quantum transitions are affected by the Zeeman Effect that splits degenerate transitions at zero magnetic field into a number of different energy states at a finite magnetic field. The primary frequency being somewhat insensitive to the magnetic field (order zero) and the higher order resonant frequencies having more and more sensitivity to the magnetic field. With a magnetic field in place, the quantum transition frequencies spread apart, and regulation circuitry in the electronics can distinguish and lock to these quantum transition frequencies.

In prior atomic clock designs, the resonant frequencies that are spread by the internal magnetic field are sensitive to changes in the external magnetic field. To prevent stray external magnetic fields from adversely affecting the frequency response of the system, a magnetic shield, or sometimes several magnetic shields, are placed around the atomic chamber, the physics cell and sometimes around the entire CSAC. Magnetic shielding is bulky, difficult to design and expensive. In a stationary atomic clock, the external magnetic fields can be calibrated out once the device is mounted in place. In portable atomic clock devices such as are increasingly used, fluctuations in the external magnetic fields will occur, and improvements are therefore needed.

SUMMARY

In described examples, a physics cell includes: a laser source configured to emit light towards an atomic chamber containing an atomic gas; a photodetector configured to receive emissions from the atomic chamber; and a field coil for generating a magnetic field in the atomic chamber. An electronics circuit includes: a controller circuit coupled to the photodetector output and having control outputs to a digital to analog converter circuit; the digital to analog converter circuit having a coil current output to adjust the magnetic field, a modulation control output to control a modulation of the light, and having an output to control a voltage controlled oscillator; and a radio-frequency output circuit having a voltage controlled oscillator coupled to the output of the digital to analog converter circuit outputting a radio frequency signal to the laser source in the physics cell.

DETAILED DESCRIPTION OF EXAMPLE EMBODIMENTS

Figure 1:
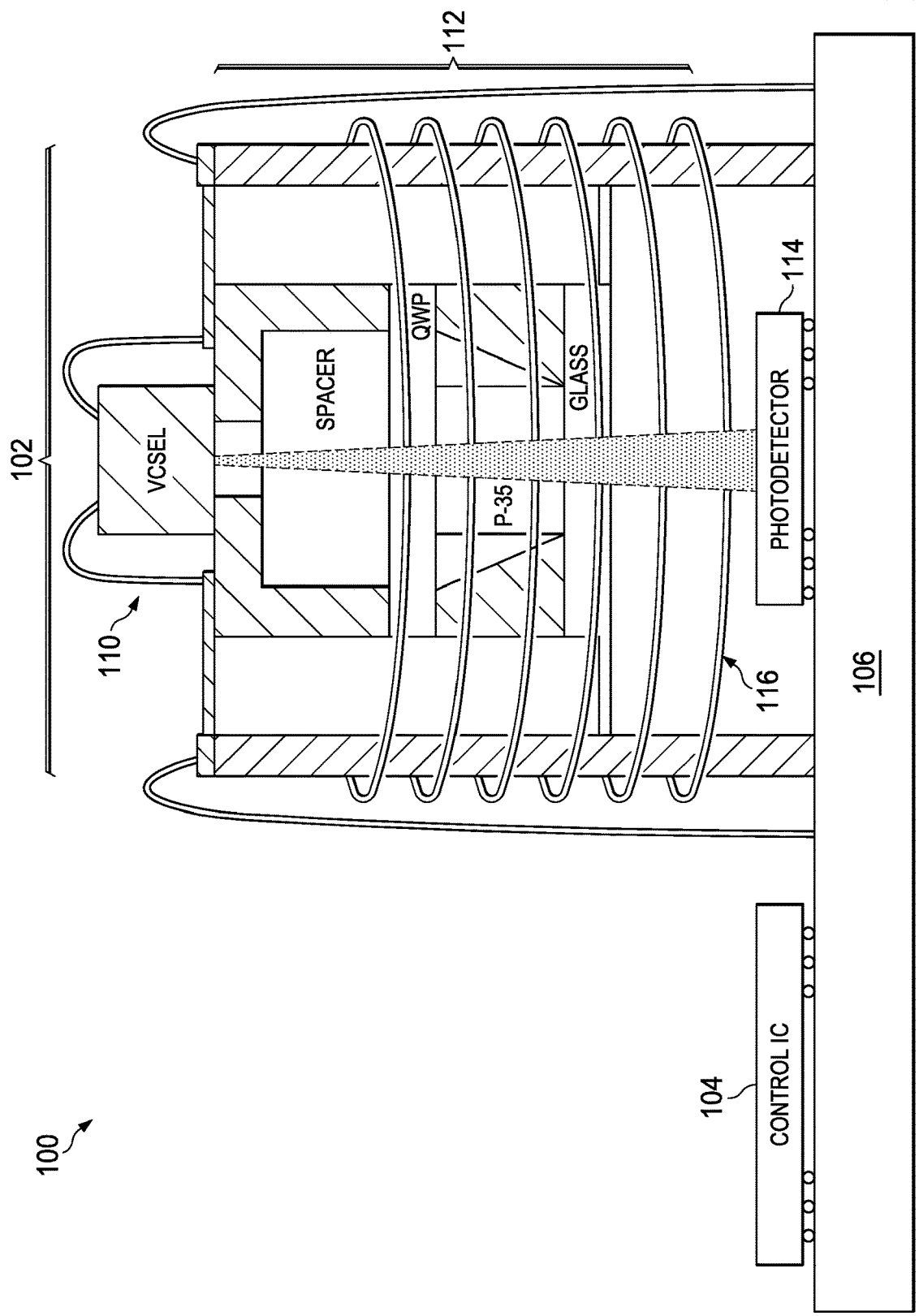
FIG. 1 is a cross section of a chip scale atomic clock device.

Corresponding numerals and symbols in the drawings generally refer to corresponding parts unless otherwise indicated. The drawings are not necessarily drawn to scale. The term "coupled" may include connections made with intervening elements, and additional elements and various connections may exist between any elements that are "coupled."

FIG. 1 is a cross section of a chip scale atomic clock device 100. In CSAC device 100, the physics cell 102 is shown as a component packaged in a ceramic body, for example, and mounted on a packaging substrate 106. In this example, the physics cell 102 contains a vertical-cavity surface-emitting laser (VCSEL) 110 with a laser beam directed through a miniature temperature stabilized atomic chamber 112. The atomic chamber includes a quarter wave polarizer labeled QWP and a chamber labeled P-35 containing a small amount of atomic gas, in this example the atomic gas is Cesium. The light emission that results from the laser energy impacting the atomic gas is received by a photodetector 114. The atomic chamber 112 is surrounded by a field coil 116 that creates an internal magnetic field so as to cause the quantum transition frequencies of the light from the atomic chamber to spread apart in frequency. The atomic chamber is sensitive to external magnetic fields as slight as the earth's magnetic field and care must be taken to ensure that the atomic chamber experiences a constant magnetic field. Magnetic fields that are not generated by the physics cell are referred to herein as "external" magnetic fields and the magnetic field that is generated by the field coil 116 of the physics cell is referred to herein as the "internal" magnetic field. The combination of the external magnetic field and internal magnetic field is the magnetic field influencing the atomic chamber 112. Not shown in FIG. 1 are heating elements that thermally stabilize the VCSEL 110 and the atomic chamber 112. The electronics portion 104 is shown as a single integrated circuit on a packaging substrate. In other implementations the electronics portion may consist of multiple integrated circuits and passive components. In some prior solutions, an internal magnetic field is produced within the system to produce the frequency separation in quantum transition frequencies, as described hereinabove. The heating elements (not shown for clarity) are typically carefully arranged to avoid creating additional internal magnetic fields that can disturb the calibration of the system, for example the various heating elements are laid out to cancel any magnetic fields the individual heating elements may produce.

Figure 2:
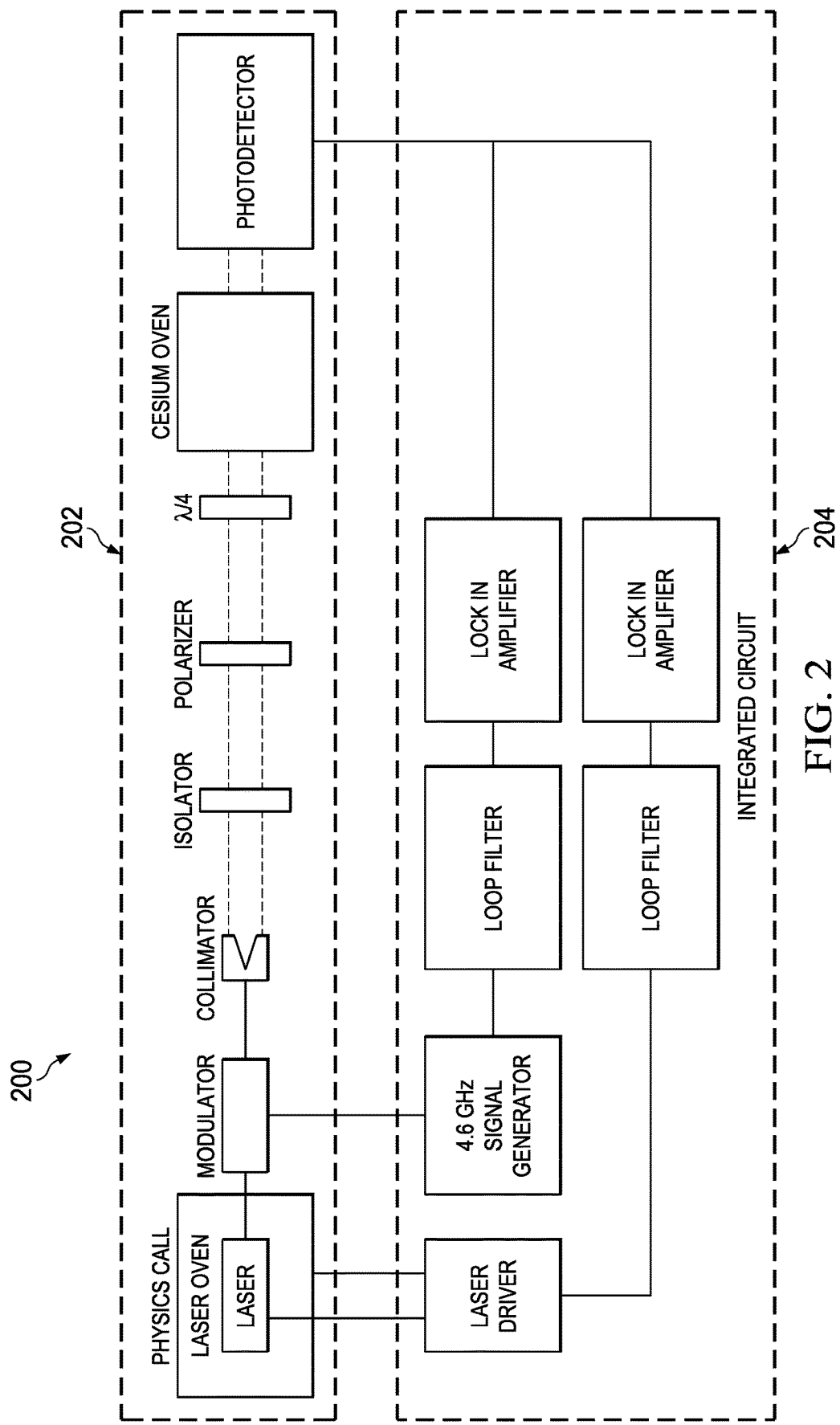
FIG. 2 is a block diagram of a chip scale atomic clock device.

FIG. 2 is a block diagram of a chip scale atomic clock device 200. In FIG. 2, elements similar to those shown in FIG. 1 are numbered similarly to FIG. 1, for clarity. For example, physics cell 202 corresponds to the physics cell 102 in FIG. 1. In FIG. 2, the particular functions of the physics cell 202 and the circuitry 204 are further shown. In the physics cell 202, a laser source including a heating element or oven and a laser is shown with light emission to a modulator that is controlled by an input signal. The modulated light is transmitted through a collimator and an optical path including an isolator, a polarizer and quarter wavelength divider into a Cesium oven. The Cesium oven emits light of a selected wavelength in response to interrogation by the laser emission. As described hereinabove, the frequency of the light that appears after passing through the atomic chamber includes quantum transition frequencies that spread apart when subjected to an internal magnetic field. The photodetector is used to collect the emissions from the Cesium atoms.

The control circuitry 204 provides control and measurement functions for the system 200. The output of the photodetector in the physics cell 202 is used with a loop filter in two paths. A signal generator generates a frequency signal to drive the modulator in the physics cell. A laser driver circuit also provides control and drive signals to the laser source. By varying the signals to the laser and the signals to the modulator and then identifying a peak response from the photodetector, the system can be locked to a frequency that corresponds to a physical constant frequency that occurs due to the quantized energy changes in energies of electrons in the Cesium atoms. Once the system is locked to a frequency, a frequency counter can be used to generate a clock output for use as a time reference that is extremely accurate. The clock output reference signal is then available for forming a clock by counting transitions up to a second, minute or longer period. Alternatively a clock may be formed by creating a coherent signal to the frequency generator signal through a phase locked loop or similar techniques.

In the embodiments, in an effort to improve the reliability of miniaturized atomic clocks and make them portable, the ability to comprehend and adapt to changing magnetic fields on the atomic clock structure results in improved accuracy, as well as enabling elimination or reduction of expensive and bulky magnetic shielding. An example embodiment uses spacing between the quantum transition frequencies to detect changes in the magnetic field. In another additional embodiment, corrective actions are applied to the field coil current in the physics cell of the CSAC to adjust the internal magnetic field to compensate for fluctuations in the external magnetic field.

Figure 3:
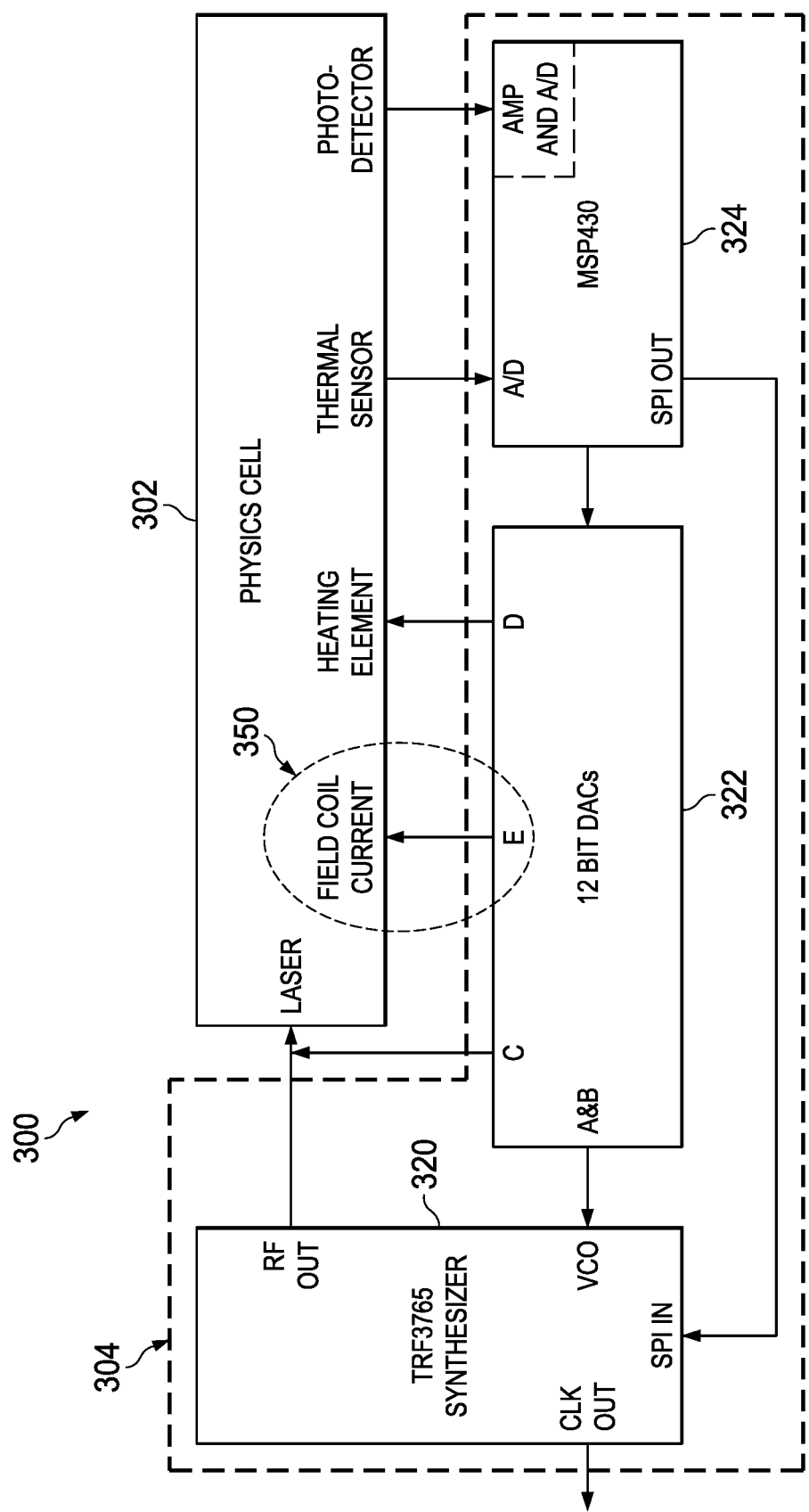
FIG. 3 is a block diagram of an embodiment for a chip scale atomic clock.

FIG. 3 is a block diagram of an embodiment chip scale atomic clock device. In FIG. 3, similar numbered elements perform similar functions as the elements in FIG. 2, for clarity. For example, in FIG. 3, physics cell 302 corresponds to physics cell 202 in FIG. 2. The physics cell 302 is shown as a block that contains components similar to those shown in the physics cell 102 in FIG. 1, including at least a laser, optical lenses, an atomic chamber, a photodetector, a heater with a thermal sensor, and a field coil for creating an internal magnetic field. The laser can be, for example, a VCSEL. The physics cell portion 302 has inputs for the laser, for the field coil current, and for controlling the heating element. The physics cell has outputs from the thermal sensor, in this example a thermocouple, and from the photodetector.

In this example embodiment, the electronics portion 304 is divided into three blocks: a fractional synthesizer 320, a 12 bit DAC 322 and a microcontroller or microprocessor 324. Microprocessor 324 is shown implemented with a MSP430 microcontroller device manufactured by Texas Instruments Incorporated. Other controller and processor devices can also be used. The synthesizer 320 has at least an RF output and a clock output. The TRF3765 device shown in this example as synthesizer 320 is a fractional synthesizer that has a serial peripheral interface (SPI) input port and a voltage input for controlling a voltage controlled oscillator (VCO). In this illustrative example, the TRF3765 fractional synthesizer with integrated VCO, manufactured by Texas Instruments Incorporated, is used. The digital-to-analog converter DAC 322 receives digital inputs from the microcontroller 324 and is coupled to the VCO in the synthesizer 320, and to the laser, field coil current and heating element in the physics cell 302. The microcontroller 324 has at least an A/D input coupled to the thermocouple output of the physics cell 302 and an amplifier and A/D coupled to the photodetector output from the physics cell 302. The microcontroller 324 communicates to the fractional synthesizer 320 on the SPI bus. The fractions used in generating the RF output can be modified by the microprocessor by use of the SPI bus. Other interfaces and control types can be used, for example an I2C interface, or memory mapped I/O interface, can be used to modify control registers in a synthesizer or fractional synthesizer.

The components shown and arranged in FIG. 3 are but one example implementation. In additional arrangements that form further embodiments, other integrated circuits can be used. In additional alternative arrangements that form embodiments, the functions of the electronic circuitry in 304 can be combined into a single integrated circuit, into a few integrated circuits, or can be implemented by use of off-the-shelf integrated circuits other than the ones shown in FIG. 3, such as integrated circuits available from a variety of manufacturers. Although a fractional synthesizer is shown in this example arrangement, other synthesizers or RF signal generators can be used. Various digital to analog converter devices (DACs) with different resolutions other than 12 bits (as shown in FIG. 3) can be used. Various programmable controllers, microprocessors, microcontrollers, CPUs, DSPs, RISC processors, and other control devices can be used. In addition, integrated circuits that can be user defined such as FPGAs, CPLDs, and ASIC devices can be used to implement portions of the functions shown in 304. Each of these alternative approaches can form additional embodiments.

In operation of the example embodiment shown in FIG. 3, Cesium gas is used in the atomic chamber (not shown for clarity) in physics cell 302. To initialize the CSAC, the atomic chamber is heated. In an example the temperature is regulated to a range of from 80 degrees C. to 100 degrees C. (other temperatures can also be used), and its temperature is stabilized by known control methods using a temperature regulation loop including the thermocouple output, the microcontroller, and the DAC output to control the heating element. The purpose of heating the cell is to evaporate the Cesium that is in a liquid state at room temperature. At 90° C. Cesium evaporates, allowing the individual atoms to interact with the light source. An advantage of the use of a heated atomic chamber with a regulated temperature is that the ambient temperature is not a controlling factor in the operation of the system. An internal magnetic field is established by energizing the field coil of the physics cell. The level of the internal magnetic field is controlled by the DAC output to the field coil current input of the physics cell, which drives current through a coil surrounding the physics cell to create the internal magnetic field. The internal magnetic field spreads the quantum transition frequencies of the cesium gas in the atomic chamber as described hereinabove. The laser is energized by the fractional synthesizer to the primary cesium resonant frequency, which is about 4.6 GHz. To lock a VCO to the frequency, a regulating loop is implemented on a quantum transition frequency. In an example arrangement, the primary quantum transition frequency, or first peak in the frequency response, is used to lock the VCO. By using the internal magnetic field to separate and stabilize the peaks in the frequency response, extremely accurate regulation can be obtained even in the presence of changing external magnetic fields, as is further explained hereinbelow.

Use of the internal magnetic field provides a spreading function that can be used to lock a magnetic control system, using the difference between peaks in the frequency response. The spacing between peaks is correlated to the strength of the magnetic field and provides a very accurate differential measurement that is used to stabilize the magnetic field experienced by the atomic chamber. If no magnetic control system were applied, the system would need extensive and bulky magnetic shielding to prevent frequency shifts due to changing external magnetic fields, including the earth's magnetic field. Further, because in the embodiments the field coil current is used to control the magnetic field in a regulated control loop, variations such as variations in the DAC output for the field coil current that can occur due to temperature dependence or device process variations can be dynamically compensated for. This field coil current regulation is performed automatically based on the differences in the peaks, eliminating the need to regulate the internal magnetic field based on the output current value that is obtained for a particular setting in the DAC 322.

Figure 4:
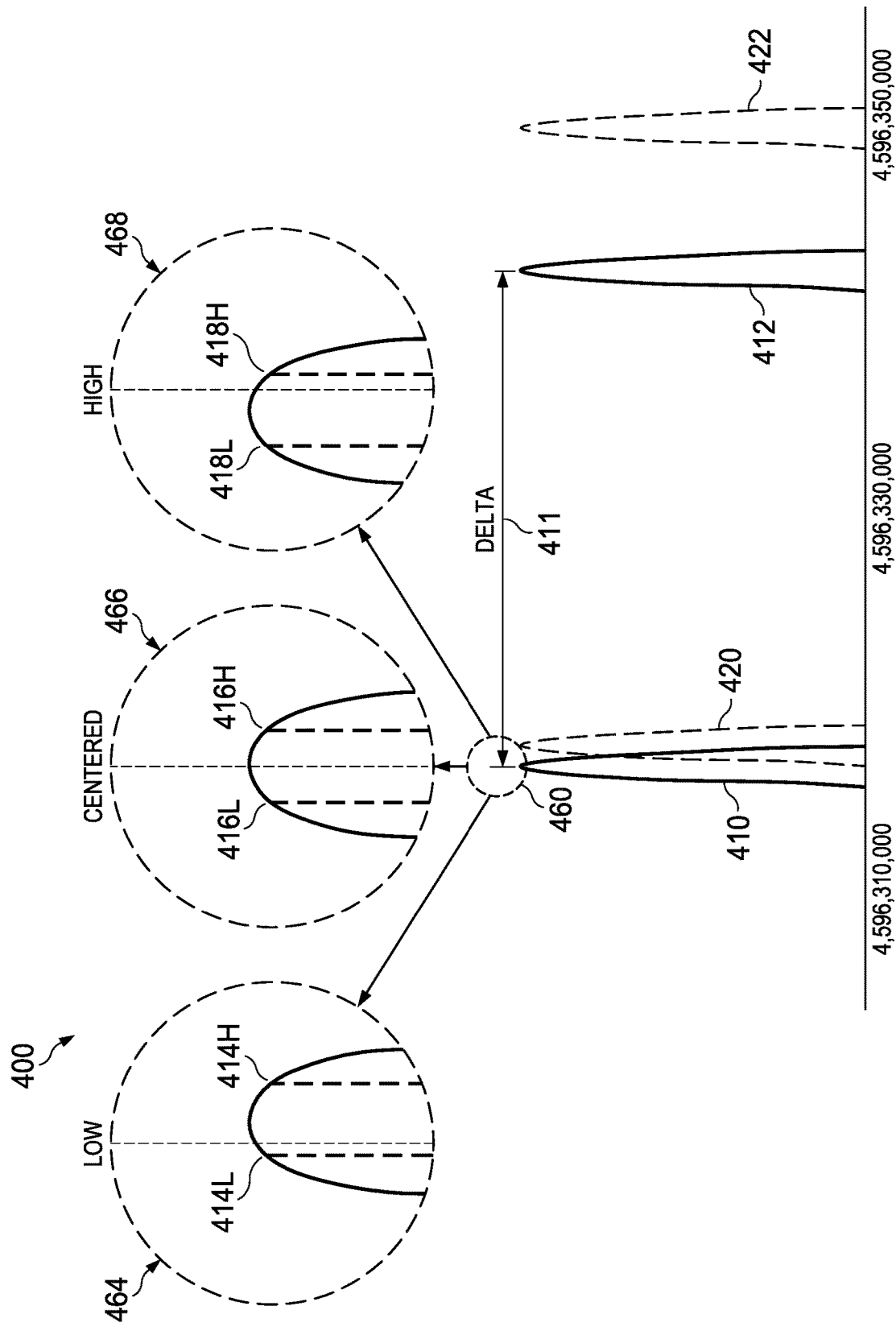
FIG. 4 is a graph showing two quantum transition frequencies of an atomic clock after frequency spreading with an applied internal magnetic field.

FIG. 4 is a graph 400 of two quantum transition frequencies of a cesium based atomic clock shown after the frequency spreading with an applied internal magnetic field. In graph 400, the horizontal or X-axis represents frequency with increasing value to the right. The vertical axis represents magnitude with increasing value upwards. Reviewing the frequency signals left to right, the first peak is the primary quantum transition frequency signal 410 that occurs with an internal magnetic field provided by the field coil current and a stable external magnetic field. The next frequency signal 420 shown in a dashed line is the primary quantum transition frequency shifted to a higher frequency as a result of an increase in the external magnetic field. The third signal 412, shown as a solid line, is the second quantum transition frequency that occurs with an internal magnetic field provided by the coil current and the stable external magnetic field. Signal 422, shown in the dashed line, is the second quantum transition frequency shifted to a higher frequency as a result of an increase in the external magnetic field. The frequency signals 410 and 420 correspond to half the difference between the 0-0 spin state and frequency signal 412 and 422 correspond to half the difference between the 0-1 spin state of the Cesium atoms in the atomic chamber.

Under operating conditions where the internal magnetic field has spread the resonant frequencies and the external magnetic field is stable, the first signal 410 is in the location of the primary resonant frequency. To lock the VCO control loop, the fractional synthesizer produces a sampling signal frequency slightly higher and slightly lower than the center frequency of the primary signal 410 to measure the signal magnitude. The location of the two sample frequencies is within the area 460 and enlarged views of the three possible scenarios are shown in views 464, 466 and 468. View 466 shows an example where the low sample frequency 416L and the high sample frequency 416H are positioned to measure the amplitude of the signal. In this example 466, the magnitudes at both frequency locations 416L and 416H are the same, meaning that the output center frequency is in alignment with the primary resonant frequency so no further adjustment to the voltage output controlling the VCO is required.

In view 464, the two sampling frequencies 414L and 414H are shown and the magnitude at frequency 414H is greater than the magnitude at frequency 414L. This result indicates that the output frequency is lower than the primary resonant frequency, resulting in the need to increase the output voltage of the DAC to the VCO. To compensate, an increased frequency at the RF Out terminal coupled to the laser with the final result that the output frequency is pushed towards the primary resonant frequency.

In view 468, the two sampling frequencies 418L and 418H are shown and the magnitude at frequency 418L is greater than the magnitude at frequency 418H. This indicates that the output frequency is higher than the primary resonant frequency resulting in the need to decrease the output voltage of the DAC to the VCO. To compensate, a decreased frequency at the RF Out terminal is coupled to the laser with the final result that the output frequency is pushed towards the primary resonant frequency.

In a portable atomic clock installation where the external magnetic field is likely to influence the atomic chamber, the quantum transition frequencies can drift more substantially, as indicated by signals 420 and 422. An embodiment forms a magnetically compensated chip scale atomic clock (MCCSAC) that will comprehend and dynamically correct for the external magnetic field variation.

In operation, the MCCSAC is initialized so the internal magnetic field will cause separation of the quantum transition frequencies, as shown in signals 410 and 412. At a time when the magnetic field is stable, during a calibration period for example, the frequency difference 411 between the two signals 410 and 412 is measured and recorded. The frequency difference 411 between the signals is sensitive to the magnitude of the magnetic field. An increase in the difference indicates an increasing magnetic field. In example embodiments, the increase in the magnetic field is compensated for by reducing the field coil current (reducing the internal magnetic field). A decrease in the difference indicates a decreasing magnetic field. The decreasing magnetic field is compensated for by increasing the coil current (increasing the internal magnetic field). In an aspect of the embodiments, the processing of the regulating loops includes a check on the primary frequency signal 410 and on the secondary frequency signal 412, resulting in regulation of the VCO voltage based on the primary frequency 410 and regulation of the internal magnetic field based on the difference between the primary quantum transition frequency 410 and the second quantum transition frequency 412. Because the rate of change of an external magnetic field is much slower than the regulation loop rate, the illustrative situation shown in FIG. 4 with the signal 422 being far away from signal 412 will not happen when the methods of the present application are in use. Because the regulation loop runs much faster than the change in magnetic field, even the slightest change in frequency difference 411 results in a correction to the field coil current to maintain the difference at the original prescribed value. The ability to dynamically adjust for varying magnetic fields allows for the reduction or elimination of the magnetic shielding needed for operation of the prior known CSACs. The need for shielding can be determined by simple observation of the system in operation.

Multiple quantum transition frequencies are produced by the atomic clock system, and the frequencies selected for the system to monitor may differ from those described in the examples hereinabove. Further, more than two frequencies can be used to detect and compensate for changes in the magnetic field. Instead of the primary frequency and one resonant frequency, additional arrangements can be formed using multiple quantum transition frequencies and observing the frequency spacing between these multiple quantum transition frequencies. The frequencies shown in the example described hereinabove are for Cesium, yet other atoms such as Rubidium may be used in the atomic clock. Use of another atom such as Rubidium will change the quantum transition frequencies, but the principles of operation for these alternative arrangements is similar including the application of a magnetic field, a locking using a peak and a frequency measurement between peaks, and magnetic compensation for changes in the spacing between peaks indicating an external magnetic field. Alkali metal atoms are convenient for use in atomic clocks because there is a single electron in the outer shell, making discrete energy jumps and creating distinct frequency responses to the interrogation by an oscillating laser source.

Figure 5:
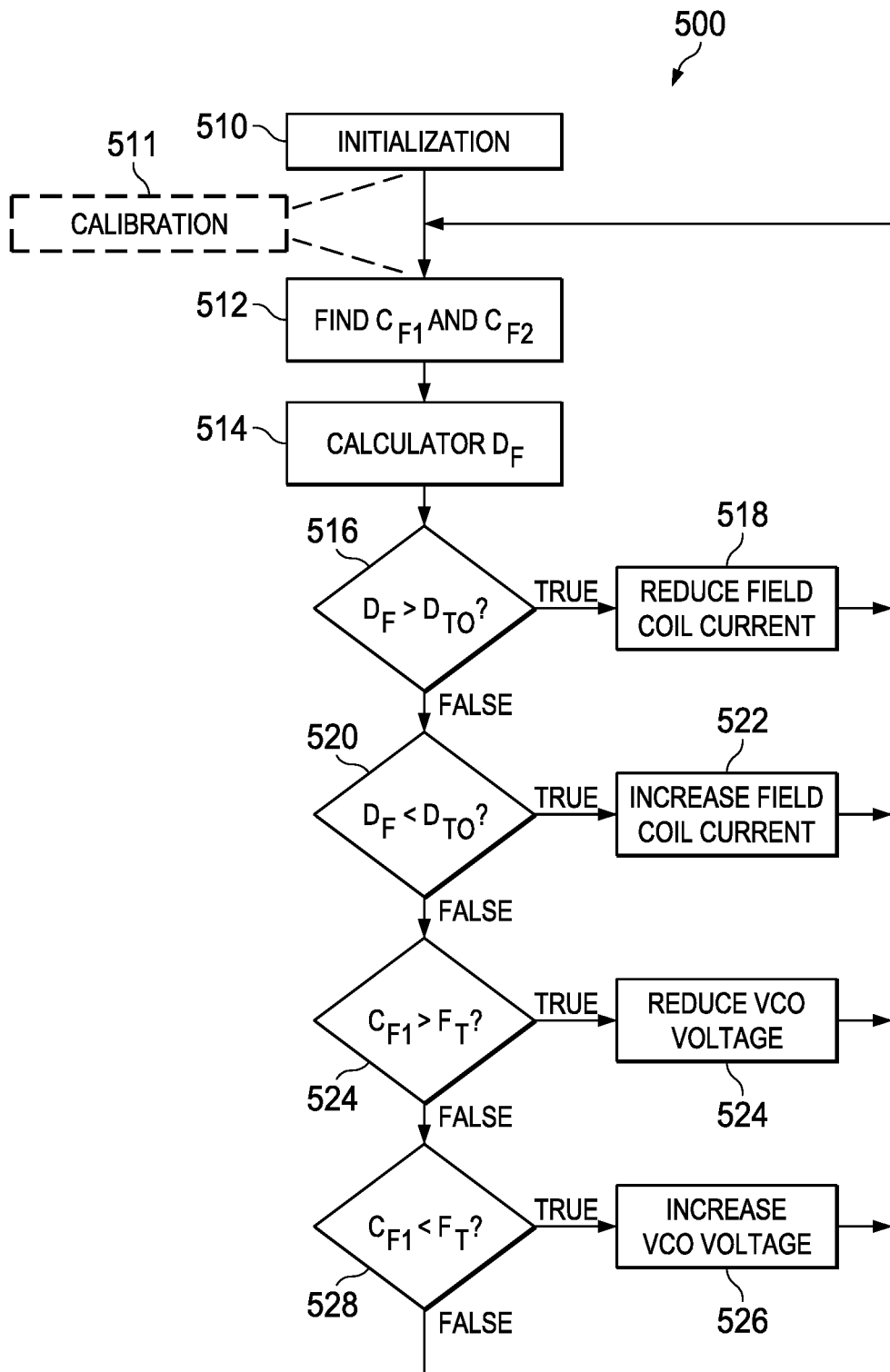
FIG. 5 is a flow chart of a method embodiment.

FIG. 5 is a flow chart of a method embodiment. For simplicity of explanation, control and monitoring of the heater and thermocouple are not shown in the flow chart. In FIG. 5, the method 500 begins with an initialization at step 510, where the physics cell is powered and initialized. Next, an optional calibration step 511 may be performed. During calibration, at least two values are recorded: the first quantum transition frequency $F_1$ (recorded as $F_T$) and the difference or delta $D_{TO}$ between the first quantum transition frequency $F_1$ and the second quantum transition frequency $F_2$. The next action at step 512 is the measurement of the first ($C_{F1}$) and second ($C_{F2}$) quantum transition frequencies. In step 514, the difference $D_F$ between $C_{F1}$ and $C_{F2}$ is calculated. In the following step 516, a decision is made. If $D_F > D_{TO}$ is true, then the coil current is reduced in step 518, resulting in a reduced internal magnetic field, and the method returns to step 512. If the comparison at step 516 is false, then at step 520 a second decision compares $D_F < D_{TO}$. If this comparison is true, then the coil current is increased at step 522 resulting in an increased internal magnetic field and the method returns to step 512. If at step 520, the comparison is false, then at step 524 a third decision block compares $C_{F1} > F_T$. If this comparison is true, then the VCO voltage is reduced at step 524 resulting in a reduced $C_{F1}$, and the method returns to step 512. If the comparison at step 524 is false, then at step 528 a fourth decision block compares $C_{F1} < F_T$. If this comparison is true, then the voltage to the VCO is increased at step 526 resulting in an increased $C_{F1}$, and the flow resumes back at step 512. If the comparison is false, the method resumes at step 512. The order of the steps in method 500 can be modified to form additional embodiments. For example, the various comparisons shown in steps FIG. 5 can be done in different orders.

In addition to the compensation scheme in the method described above, in an additional alternative embodiment the methods can also be extended to provide an output that indicates the value of the external magnetic field, or a relative value corresponding to the external magnetic field compared to the internal field. That is, because the observed frequency difference corresponds to changes in the magnetic field, changes in the magnetic field can be measured by the system and made available for use by the system. This information can be valuable in applications where the external magnetic field is of particular interest.

Modifications are possible in the described embodiments, and other additional arrangements are possible that form further embodiments within the scope of the claims.

What is claimed is:

1. An apparatus, comprising:
   a physics cell including:
      an atomic chamber containing an atomic gas;
      a laser source having a laser control input and a light output, in which the light output is responsive to the laser control input;
      a modulator having a modulator control input, a light input and a modulated light output, the light input optically coupled to the light output, and the modulated light output optically coupled to the atomic chamber, in which the modulated light output is responsive to the modulator control input;
      a photodetector having a photodetector input and a photodetector output, the photodetector input optically coupled to the atomic chamber, in which the photodetector is configured to generate photodetector signals at the photodetector output responsive to the photodetector input; and
      a field coil around the atomic chamber, the field coil having a coil control input, and the field coil configured to generate a magnetic field in the atomic chamber responsive to the coil control input; and
   an electronic circuit including:
      a frequency synthesizer having a frequency output coupled to the laser control input, the frequency synthesizer including a voltage controlled oscillator having an oscillator control input and an oscillator output, in which the oscillator output is responsive to the oscillator control input, and the frequency output is responsive to the oscillator output;
      a controller having a control input and control outputs, the control input coupled to the photodetector output, and the controller configured to: detect first and second resonant frequencies in the photodetector signals; determine a change in difference between the first and second resonant frequencies; and adjust the control outputs responsive to the change; and
      a digital-to-analog converter (DAC) having digital inputs and first, second and third analog outputs, the digital inputs coupled to the control outputs, the first analog output coupled to the modulator control input, the second analog output coupled to the coil control input, the third analog output coupled to the oscillator control input, and the DAC configured to adjust the second analog output responsive to the control outputs.

2. The apparatus of claim 1, wherein the laser source is a vertical cavity surface emitting laser.

3. The apparatus of claim 1, wherein the physics cell includes a heating element having a heating control input, the heating element is responsive to the heating control input, and the DAC has a fourth analog output coupled to the heating control input.

4. The apparatus of claim 3, wherein the heating element is configured to heat the atomic chamber to a temperature between 80 degrees and 90 degrees Celsius.

5. The apparatus of claim 1, wherein the DAC is configured to adjust the second analog output in a manner that decreases the magnetic field responsive to an increase in the difference.

6. The apparatus of claim 1, wherein the DAC is configured to adjust the second analog output in a manner that increases the magnetic field responsive to a decrease in the difference.

7. The apparatus of claim 1, wherein the atomic gas in the atomic chamber includes cesium gas.

8. The apparatus of claim 1, wherein the atomic gas in the atomic chamber includes rubidium gas.

9. The apparatus of claim 1, wherein the physics cell is packaged as a module.

* * * * *